United States Patent [19]
Jinbo et al.

[11] Patent Number: 5,608,682
[45] Date of Patent: Mar. 4, 1997

[54] SEMICONDUCTOR MEMORY DEVICE

[75] Inventors: Shinichi Jinbo; Shigeru Mori, both of Hyogo, Japan

[73] Assignee: Mitsubishi Denki Kabushiki Kaisha, Tokyo, Japan

[21] Appl. No.: 554,503

[22] Filed: Nov. 7, 1995

[30] Foreign Application Priority Data

Feb. 22, 1995 [JP] Japan .................... 7-033644

[51] Int. Cl.$^6$ ...................... G11C 7/00
[52] U.S. Cl. ............... 365/222; 365/189.05; 365/189.07; 365/194
[58] Field of Search .............. 365/222, 189.05, 365/189.07, 193, 194

[56] References Cited

U.S. PATENT DOCUMENTS 4,939,695 7/1990 Isobe et al. .................... 365/222
5,251,178 10/1993 Childers ......................... 365/222
5,315,557 5/1994 Kim et al. ....................... 365/222

*Primary Examiner*—Son T. Dinh
*Attorney, Agent, or Firm*—Lowe, Price, LeBlanc & Becker

[57] ABSTRACT

An address generating circuit and an address switching circuit of a DRAM output address signals A0 to A11 according to a refresh cycle time set by the user being less than a predetermined value, and output address signals A0 to A10 according to the refresh cycle time being the predetermined value or more. A row decoder selects one word line in response to the signals A0 to A11, and selects two word lines in response to the signals A0 to A10. Since refresh is carried out by selecting two word lines when the refresh cycle time is at the predetermined value or more, disappearance of data can be prevented.

4 Claims, 10 Drawing Sheets

SEMICONDUCTOR MEMORY DEVICE

BACKGROUND OF THE INVENTION

1. Field of the Invention

The present invention generally relates to semiconductor memory devices, and more particularly, to a semiconductor memory device which requires refresh of data.

2. Description of the Background Art

FIG. 5 is a block diagram showing a configuration of a conventional dynamic random access memory (hereinafter referred to as a "DRAM") having a storage capacity of 16M bits.

Referring to FIG. 5, this DRAM includes control signal input terminals 30 to 32 and 34, an address signal input terminal group 33, a data signal input/output terminal group 35, a ground terminal 36, and a power supply terminal 37. This DRAM further includes a clock generating circuit 38, a row and column address buffer 39, an address switching circuit 40, an address generating circuit 41, a row decoder 42, a column decoder 43, a memory mat 44, an input buffer 47, and an output buffer 48. Memory mat 44 includes a memory array 45 and a sense refresh amplifier+input/output control circuit 46.

Clock generating circuit 38 selects a predetermined operation mode in response to signals ext./RAS and ext./CAS (in this specification and the drawings, /indicates that an activation level is at a logical low or L level) externally applied through control signal input terminals 30 and 31, and controls the whole DRAM.

Row and column address buffer 39 selectively provides address signals A0 to A11 externally applied through address signal input terminal group 33 to row decoder 42 and column decoder 43 during reading and writing operations. Address generating circuit 41 is activated in response to a refresh instruct signal/CBR output from clock generating circuit 38, and provides an address signal for refresh to row decoder 42 during a refresh operation. Address switching circuit 40 is controlled by the refresh instruct signal/CBR, connects row and column address buffer 39 and row decoder 42 during the reading and writing operations, and connects address generating circuit 41 and row decoder 42 during the refresh operation.

Memory array 45 has a storage capacity of 16M bits. Data of one bit is stored in one memory cell. Each memory cell is arranged at a predetermined address determined by a row address and a column address.

Row decoder 42 specifies a row address of memory array 45 in response to an address signal applied from row and column address buffer 39 or address generating circuit 41. Column decoder 43 specifies a column address of memory array 45 in response to an address signal applied from row and column address buffer 39.

Sense refresh amplifier+input/output control circuit 46 connects a memory cell at an address specified by row decoder 42 and column decoder 43 to one end of a global signal input/output line pair GIO during the reading and writing operations. Further, sense refresh amplifier+input/output control circuit 46 refreshes data of memory cells at the row address specified by row decoder 42 during the refresh operation.

The other end of global signal input/output line pair GIO is connected to input buffer 47 and output buffer 48. Input buffer 47 provides data input from data signal input/output terminal group 35 to a selected memory cell through global signal input/output line pair GIO in response to a signal ext./W externally applied through control signal input terminal 32 during the writing operation. Output buffer 48 outputs read data from the selected memory cell to data input/output terminal group 35 in response to a signal ext./OE input from control signal input terminal 34 during the reading operation.

FIG. 6 shows a chip layout of the DRAM shown in FIG. 5. Referring to FIG. 6, the DRAM includes four memory mats 44.1 to 44.4 each having a storage capacity of 4M bits. Memory mats 44.1 to 44.4 each include 16 memory arrays MA1 to MA16 each having a storage capacity of 256K bits. Four memory mats 44.1 to 44.4 constitute memory mat 44 of FIG. 5.

Row decoders 42.1 to 42.4 are arranged on respective chip center sides of memory mats 44.1 to 44.4 along chip longer sides. Row decoders 42.1 to 42.4 constitute row decoder 42 of FIG. 5.

Column decoders 43.1 to 43.4 are arranged on respective chip center sides of memory mats 44.1 to 44.4 along chip shorter sides. Column decoders 43.1 to 43.4 constitute column decoder 43 of FIG. 5. Clock generating circuit 38 shown in FIG. 5 and the like are arranged in a peripheral circuit region 49 at the chip center portion.

FIG. 7 is a circuit block diagram showing a configuration of memory array MA16 shown in FIG. 6 with one part omitted. Referring to FIG. 7, memory array MA16 includes a plurality of memory cells MC arranged in rows and columns, a word line WL provided corresponding to each memory cell row, and a bit line pair BLP provided corresponding to each memory cell column. Memory cell MC includes an MOS transistor Q for access and a capacitor C for information storage. Word line WL transmits output of row decoder 42.1 and activates memory cells MC of a selected row. Bit line pair BLP includes bit lines BL, /BL to which signals complementary to each other are transmitted, and carries out input and output of a data signal to and from selected memory cell MC.

A bit line equalize circuit 56 for equalizing bit lines BL, /BL to a bit line potential $V_{BL}$ (=Vcc/2) before selection of memory cell MC is arranged at one ends of bit lines BL, /BL. Bit line equalize circuit 56 includes N channel MOS transistors 53 and 54 connected between bit lines BL, /BL and a node N51, and an N channel MOS transistor 55 connected between bit lines BL and/BL. MOS transistors 53 to 55 receive a bit line equalize signal BLEQ at their gates. The bit line potential $V_{BL}$ (=Vcc/2) is applied to node N51. Node N51 is connected to bit line pair BLP of adjacent memory array MA15 through a transfer gate 52. Transfer gate 52 includes N channel MOS transistors 50 and 51. N channel MOS transistors 50 and 51 receive a signal BLI at their gates.

A sense refresh amplifier 61 for amplifying a small potential difference which appears between bit lines BL and /BL after selection of memory cell MC is arranged between bit lines BL and /BL. Sense refresh amplifier 61 includes N channel MOS transistors 57 and 58 connected between bit lines BL, /BL and a node N52, and P channel MOS transistors 59 and 60 connected between bit lines BL, /BL and a node N53. The gates of MOS transistors 57 and 59 are both connected to bit line /BL, and the gates of MOS transistors 58 and 60 are both connected to bit line BL. Nodes N52 and N53 receive sense amplifier activation signals /SE and SE output from a sense amplifier drive circuit 62, respectively. Sense amplifier drive circuit 62 is included in clock generating circuit 38 of FIG. 5.

The other ends of bit lines BL, /BL are connected to one ends of local signal input/output lines LIOL, /LIOL through a column select gate 65. Column select gate 65 includes N channel MOS transistors 63 and 64 connected between bit lines BL, /BL and local signal input/output lines LIOL, /LIOL, respectively. The gates of MOS transistors 63 and 64 are connected to column decoder 43.1 through a column select line CSL. The other end of local signal input/output line pair LIOL is connected to one end of global signal input/output line pair GIO of FIG. 5 through a block select switch, not shown. The other memory arrays MA1 to MA15 have the same configuration.

An operation of the DRAM shown in FIGS. 5 to 7 will be described briefly. In the writing operation, column decoder 43 pulls up column select line CSL of a column corresponding to an address signal to a logical high or H level which is an activation level to render column select gate 65 conductive. Further, the block select switch, not shown, is rendered conductive, and selected bit line pair BLP is connected to input buffer 47 through local signal input/output line pair LIO and global signal input/output line pair GIO.

Input buffer 47 applies write data from data signal input/output terminal group 35 to selected bit line pair BLP through global signal input/output line pair GIO and local signal input/output line pair LIO in response to the signal ext./W. The write data is applied as a potential difference between bit lines BL and /BL. Then, row decoder 42 pulls up word line WL of a row corresponding to the address signal to the H level which is an activation level, and renders MOS transistors Q of memory cells MC of the row. An amount of electric charge according to the potential of bit line BL or /BL is stored in capacitor C of selected memory cell MC.

Since electric charge of capacitor C of memory cell MC gradually flows out, refresh of data is carried out in a predetermined cycle. FIG. 8 is a timing chart showing the refresh operation. Upon detection that the signal ext./CAS falls before the signal ext./RAS falls, clock generating circuit 38 outputs the refresh instruct signal /CBR. In response to the falling of the signal ext./RAS, signals BLI and BLEQ fall, and MOS transistors 50 and 51 of transfer gate 52 and MOS transistors 53 to 55 of bit line equalize circuit 56 are disconnected.

In response to the signal /CBR, address generating circuit 41 outputs an address signal Add. which is different from the previously output address signal. Row decoder 42 pulls up word line WL of a row corresponding to the address signal Add. to the H level. The potentials of bit lines BL and /BL change only by a small amount according to the amount of electric charge of capacitor C of activated memory cell MC.

Then, sense amplifier drive circuit 62 pulls up the sense amplifier activation signal SE to the H level and pulls down the sense amplifier activation signal /SE to the L level to activate sense refresh amplifier 61. When the potential of bit line BL is higher than that of bit line /BL by a small amount, resistance values of MOS transistors 58 and 59 become smaller than those of MOS transistors 57 and 60, causing the potential of bit line BL to be pulled up to the H level and the potential of bit line /BL to be pulled down to the L level. On the contrary, when the potential of bit line /BL is higher than that of bit line BL by a small amount, resistance values of MOS transistors 57 and 60 become smaller than those of MOS transistors 58 and 59, causing the potential of bit line /BL to be pulled up to the H level and the potential of bit line BL to be pulled down to the L level.

When the signal ext./RAS rises to the H level which is a non-activation level, word line WL is pulled down to the L level which is a non-activation level. Refresh of data is thus completed.

In the reading operation, data of memory cells MC of a row selected by row decoder 42 is read out to bit line pair BLP as in the refresh operation, and data of bit line pair BLP of a column selected by column decoder 43 is provided to output buffer 48 through local signal input/output line pair LIO and global signal input/output line pair GIO. Output buffer 48 outputs read data to data signal input/output terminal group 35 in response to the signal ext./OE.

In such a DRAM, there is a variation in leakage current of memory cell MC among chips, leading to variation in cycle of data refresh. Therefore, a cycle of data refresh is measured for each chip, and respective chips are classified into a 32 ms product group and a 64 ms product group, for example, based on the measurement result. The 32 ms product refers to a chip which requires refresh of data every 32 ms per one memory cell MC, and the 64 ms product refers to a chip which requires refresh of data every 64 ms per one memory cell MC.

A DRAM chip is shipped as a 4K mode product or a 2K mode product depending on the user's need. A 4K mode refers to a mode in which only one word line WL is selected in one refresh operation. A 2K mode refers to a mode in which two word lines WL are selected in one refresh operation.

The DRAM shown in FIGS. 5 to 8 has approximately 4,000 word lines WL. Therefore, the 4K mode means that 4K refresh operations are required if word line WL is selected one by one. The 2K mode means that 2K refresh operations are required if word line WL is selected two by two.

Generally, the 32 ms product is set at the 2K mode, and shipped as a 2K mode 32 ms product. The 64 ms product is set at the 4K mode, and shipped as a 4K mode 64 ms product. A refresh cycle time required for one refresh operation is 32 ms/2K=16 µs for the 2K mode 32 ms product, and 64 ms/4K=16 µs for the 4K mode 64 ms product.

FIG. 9 is a circuit block diagram showing a configuration of a part related to the refresh operation of the DRAM shown in FIGS. 5 to 8. In the figure, a CBR signal generating circuit 38a outputs the refresh instruct signal/CBR in response to the signals ext./RAS and ext./CAS. CBR signal generating circuit 38a is included in clock generating circuit 38 of FIG. 5.

Address generating circuit 41 includes a pad 70, a refresh counter 71, and an address switching circuit 72. Pad 70 is bonded to a power supply line or a ground line, not shown, according to the 4K mode or the 2K mode. Refresh counter 71 counts the signal/CBR, and outputs the address signals A0 to A11 of 12 bits. The least significant bit of the output of counter 71 is the signal A0, and the most significant bit of the output of counter 71 is the signal A11.

Address switching circuit 72 includes an address switching circuit 72a corresponding to the address signals A0 to A10, and an address switching circuit 72b corresponding to the address signal A11. Address switching circuit 72a directly passes the address signals A0 to A10. Address switching circuit 72b passes the address signal A11 when pad 70 is bonded to the power supply line and the 4K mode is selected, and prevents passing of the address signal A11 when pad 70 is bonded to the ground line and the 2K mode is selected.

Address switching circuit 40 includes an address switching circuit 40a corresponding to the address signals A0 to A10, and an address switching circuit 40b corresponding to the address signal A11. Address switching circuit 40 provides the address signals A0 to A11 from row and column address buffer 39 to row decoder 42 during the writing and reading operations, and provides the address signals A0 to A11 or the address signals A0 to A10 from address switching circuit 72 in response to the refresh instruct signal/CBR. Row decoder 42 selects one word line WL in memory array 45 in response to the address signals A0 to A11, and selects two word lines WL in memory array 45 in response to the address signals A0 to A10.

The signal A11 is for determining whether word line WL to be selected belongs to memory arrays MA1 to MA4 or memory arrays MA5 to MA8, as shown in FIG. 10. Therefore, in the 4K mode in which the signal A11 is provided, one memory array (for example, MA1) to which word line WL belongs is determined, and one word line WL belonging to memory array MA1 is selected. However, in the 2K mode in which the signal A11 is not provided, it is not determined which of two memory arrays (for example, MA1 and MA5) word line WL belongs to, and one word line WL belonging to memory array MA1 and one word line WL belonging to memory array MA5 are simultaneously selected.

However, in the conventional DRAM, when the user sets the refresh cycle time to a standard value of a long refresh product which is larger than a standard value (16 μs) of an ordinary product in order to gain write and read times, data disappears if the ability of a chip as a long refresh product is marginal.

On the contrary, the user may set the refresh cycle time far shorter than the standard value (16 μs) for fear of disappearance of data. In this case, current consumption is increased.

SUMMARY OF THE INVENTION

The main object of the present invention is to provide a semiconductor memory device which can prevent disappearance of data and increase in power consumption.

In brief, in a semiconductor memory device according to one aspect of the present invention, a refresh cycle time set by the user is detected by a detecting circuit, and a memory cell row of the number according to the refresh cycle time is refreshed in one refresh cycle. Therefore, unlike a conventional semiconductor memory device in which the number of memory cell rows to be refreshed in one refresh cycle is fixed, data does not disappear, or power consumption is not increased depending on whether the refresh cycle time being long or short.

In brief, in a semiconductor memory device according to another aspect of the present invention, a refresh cycle time set by the user and a predetermined time are compared by a comparing circuit. In response to the comparison result that the refresh cycle time is shorter than the predetermined time, one memory cell row is refreshed in one refresh cycle by a selecting circuit and a refresh circuit, and in response to the comparison result that the refresh cycle time is longer than the predetermined time, a plurality of memory cell rows are refreshed in one refresh cycle by the selecting circuit and the refresh circuit. Therefore, unlike the conventional semiconductor memory device in which the number of memory cell rows to be refreshed in one refresh cycle is fixed, data does not disappear, or power consumption is not increased depending on whether the refresh cycle time being long or short.

Preferably, the comparing circuit includes a timer circuit reset by a delay signal of a refresh instruct signal, and a latch circuit latching an output level of the timer circuit in response to the refresh instruct signal. The selecting circuit selects one or a plurality of memory cell rows according to the latch level of the latch circuit. As a result, the comparing circuit and the selecting circuit can be configured easily.

Preferably, the selecting circuit includes a signal generating circuit outputting a first address signal indicating one memory cell row in response to the refresh instruct signal, a signal converting circuit converting the first address signal to a second address signal indicating a plurality of memory cell rows according to the latch level of the latch circuit, and a decode circuit selecting a memory cell row according to output of the signal converting circuit. As a result, the selecting circuit can be configured easily.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
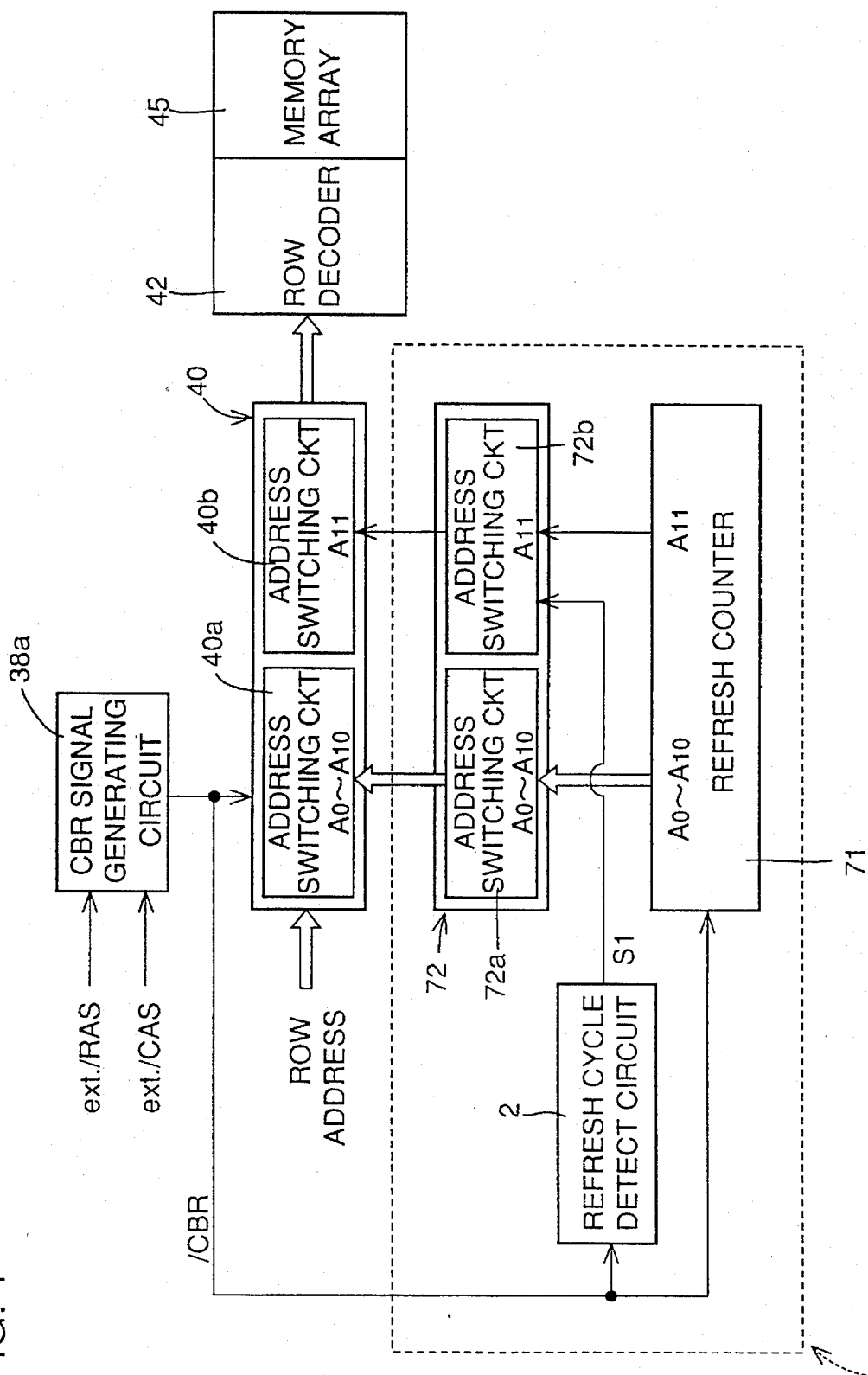
FIG. 1 is a circuit block diagram showing a configuration of a part related to a refresh operation of a DRAM according to one embodiment of the present invention.
Figure 9:
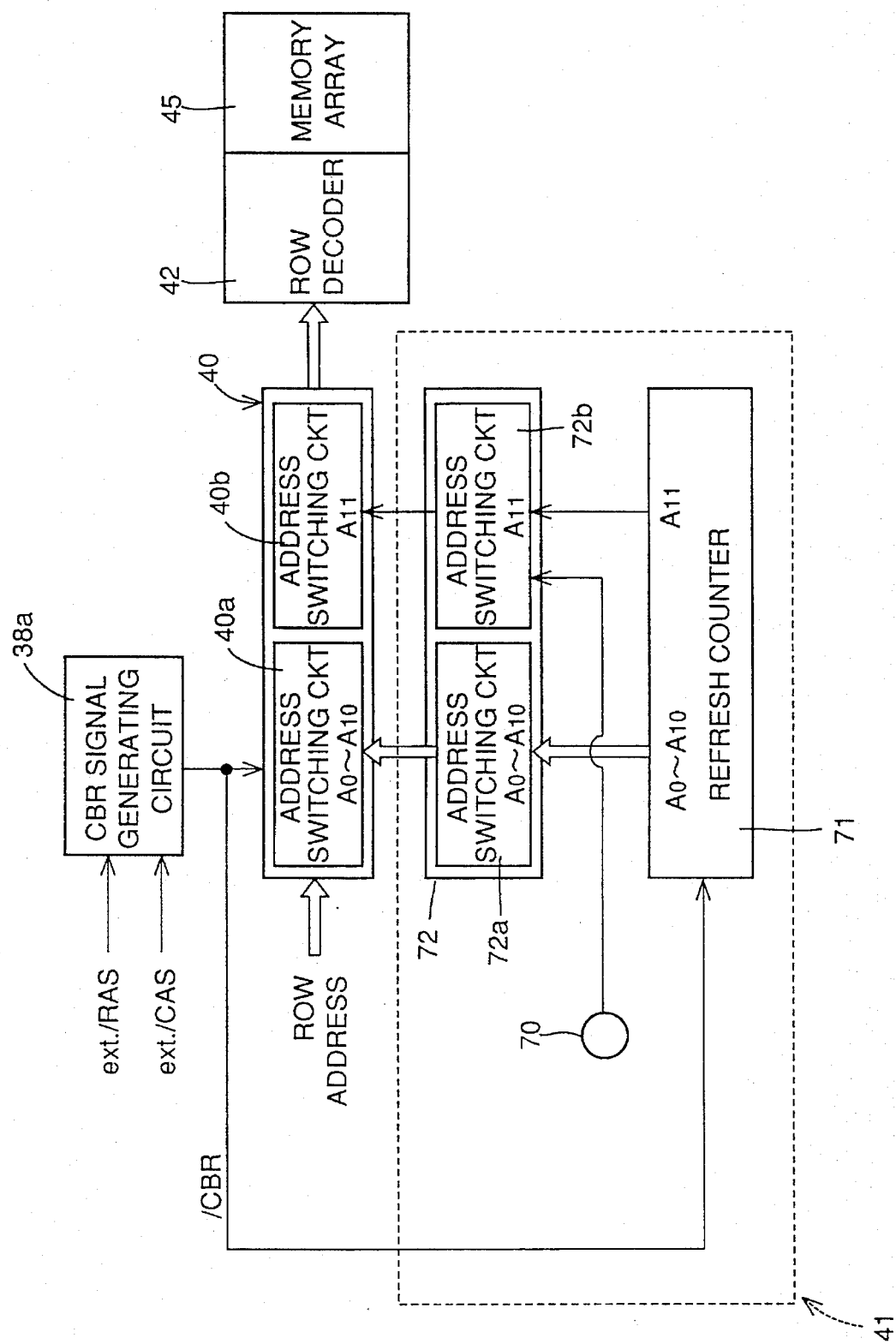
FIG. 9 is a circuit block diagram showing a configuration of a part related to the refresh operation of the DRAM shown in FIG. 5.
Figure 10A:
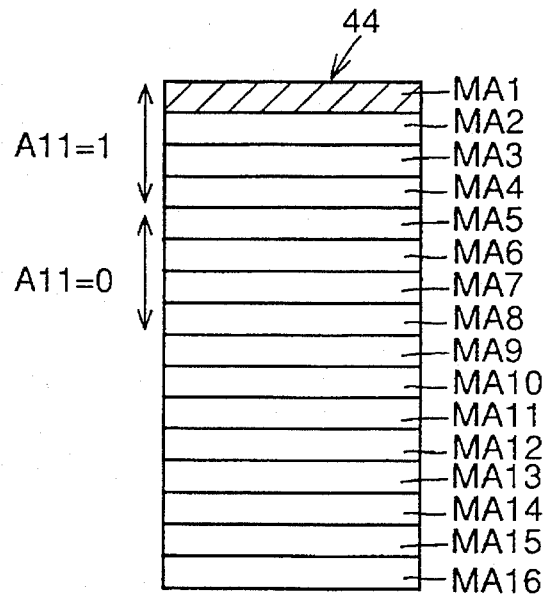
FIGS. 10A and 10B are block diagrams describing an operation of the circuit shown in FIG. 9.
Figure 10B:
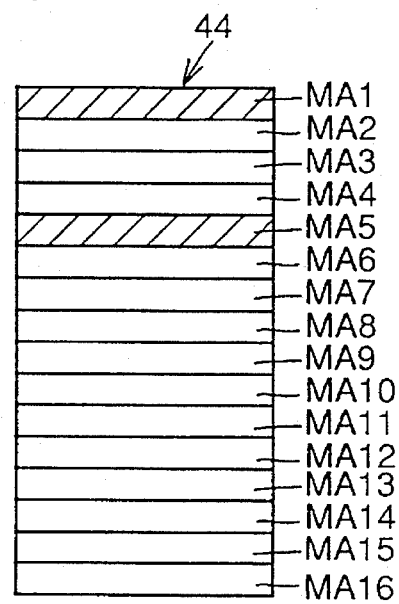

FIG. 1 is a circuit block diagram showing a configuration of a part related to a refresh operation of a DRAM according to one embodiment of the present invention, which should be compared to FIG. 9. Since the other portion of the DRAM has the same configuration and operates in the same way as the conventional DRAM, the description thereof will not be repeated.

Figure 2:
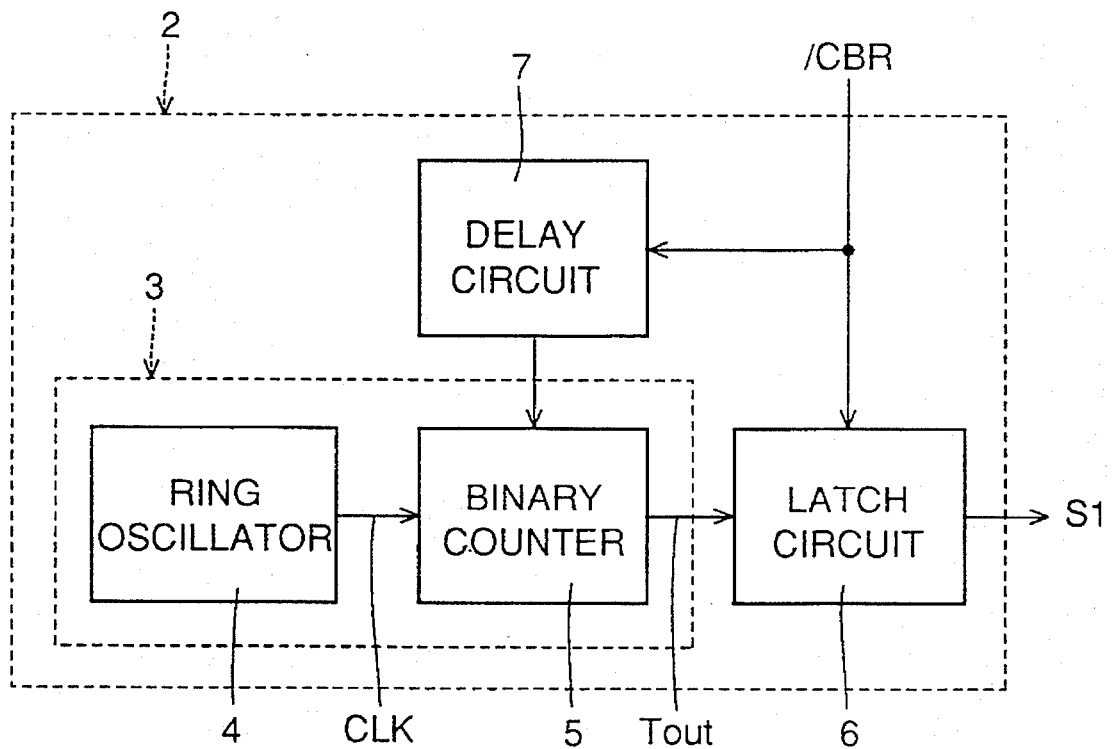
FIG. 2 is a circuit block diagram showing a configuration of a refresh cycle detecting circuit of the DRAM shown in FIG. 1.

Referring to FIG. 1, an address generating circuit 1 of the DRAM is different from address generating circuit 41 of the conventional DRAM in that a refresh cycle detect circuit 2 is provided instead of pad 70 for mode switching. Refresh cycle detect circuit 2 includes a timer 3, a latch circuit 6, and a delay circuit 7, as shown in FIG. 2. Timer 3 includes a ring oscillator 4 and a binary counter 5.

Ring oscillator 4 outputs a clock signal CLK of a predetermined cycle (for example 1 µs) to an input terminal of binary counter 5. Delay circuit 7 delays the refresh instruct signal/CBR by a predetermined delay time Td, and outputs the delayed signal to a reset terminal of binary counter 5. Binary counter 5 is reset by the output of delay circuit 7. Binary counter 5 outputs the H level until passage of a set time Ts from reset, and outputs the L level thereafter.

Latch circuit 6 latches an output Tout of binary counter 5 in response to the refresh instruct signal/CBR. An output S1 of latch circuit 6 is input to address switching circuit 72b of FIG. 1. Address switching circuit 72b passes the signal A11 output from refresh counter 71 when the signal S1 is at the H level, and prevents passage of the signal A11 when the signal S1 is at the L level.

Figure 3:
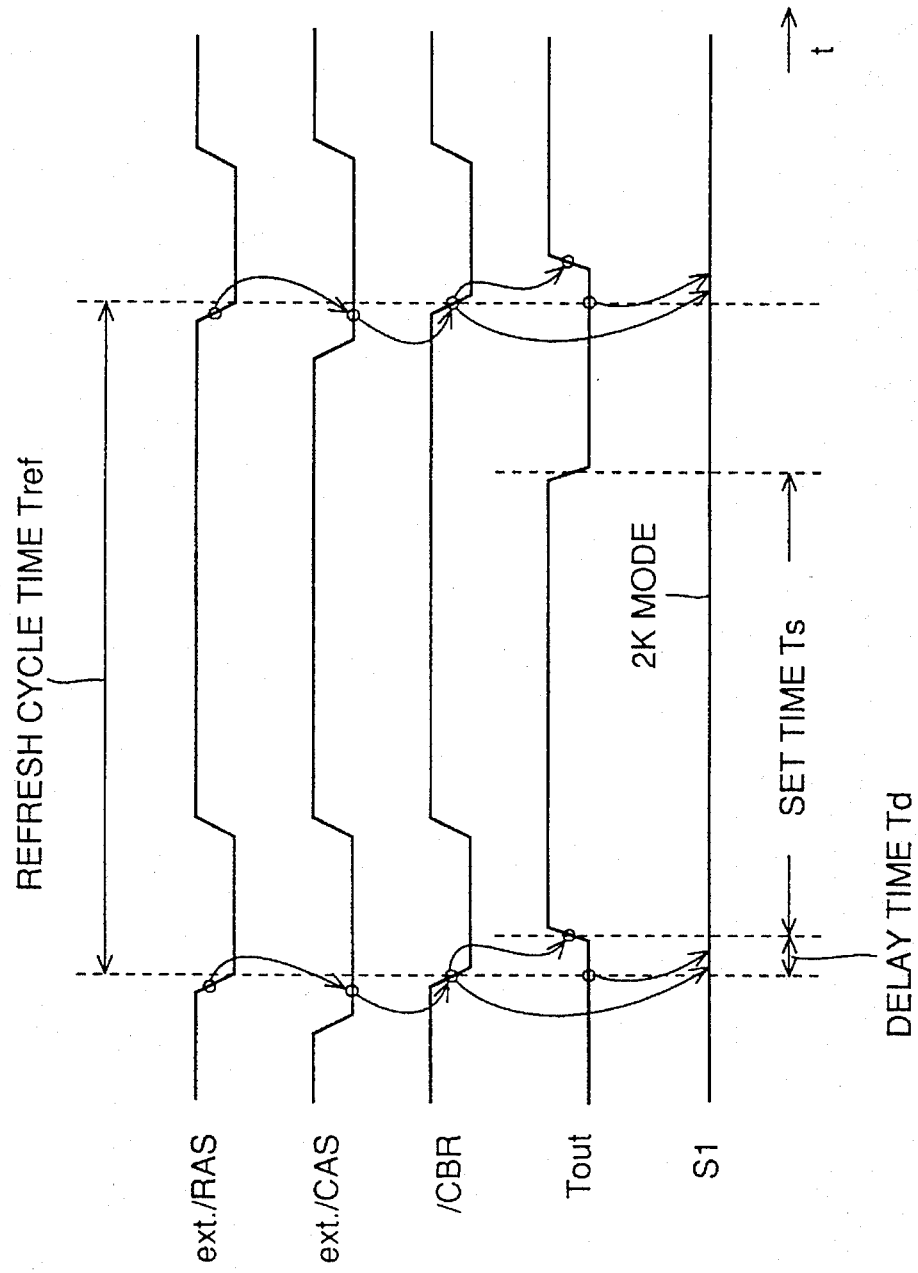
FIG. 3 is a timing chart showing an operation of the DRAM shown in FIG. 1.

FIG. 3 is a timing chart showing an operation of address generating circuit 1 when a refresh cycle time Tref set by the user is equal or larger than the sum Ts+Td of the set time Ts of timer 3 and the delay time Td of delay circuit 7.

In an initial state where the signals est./RAS and ext./CAS have not been input yet, the output Tout of timer 3 and the output S1 of latch circuit 6 are both at the L level, and the 2K mode is selected.

The refresh instruct signal/CBR falls to the L level which is an activation level in response to the first input of the signals ext./RAS and ext./CAS. In response to the falling, latch circuit 6 latches the output Tout of timer 3. Since timer 3 is not reset yet at this time, the output Tout of timer 3 remains at the L level. Therefore, the output S1 of latch circuit 6 attains the L level, and the 2K mode is selected.

After the delay time Td of delay circuit 7 since the refresh instruct signal/CBR fell, timer 3 is reset, and the output Tout of timer 3 attains the H level. The output Tout of timer 3 attains the L level again after the set time Ts.

Then, in response to the second input of the signals ext./RAS and ext./CAS, the refresh instruct signal/CBR falls to the L level. In response to the falling, latch circuit 6 latches the output Tout of timer 3. Since the output Tout of timer 3 already falls to the L level at this time, the output S1 of latch circuit 6 is kept at the L level, and the 2K mode is again selected. The similar operation continues.

Figure 4:
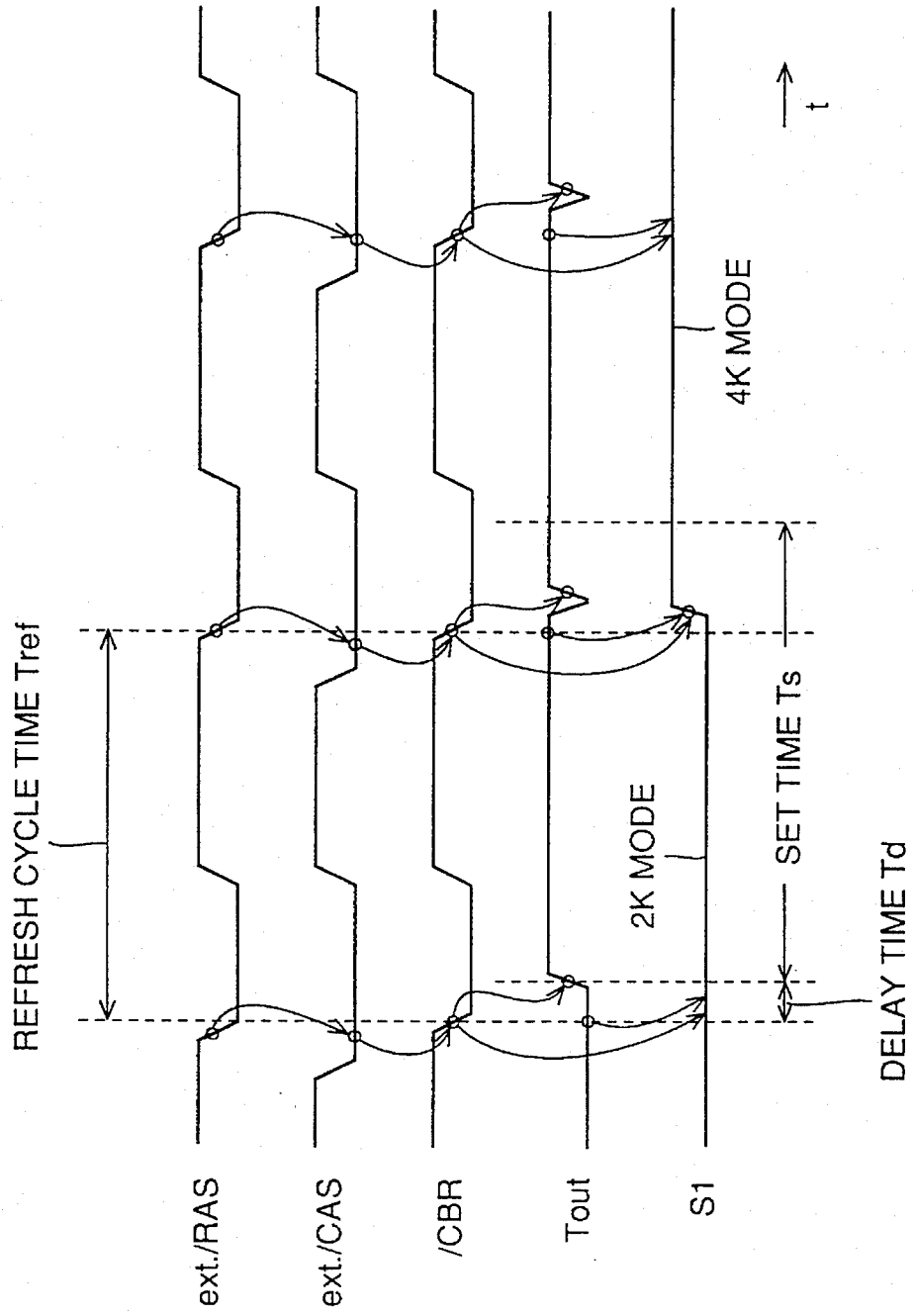
FIG. 4 is a timing chart showing another operation of the DRAM shown in FIG. 1.
Figure 5:
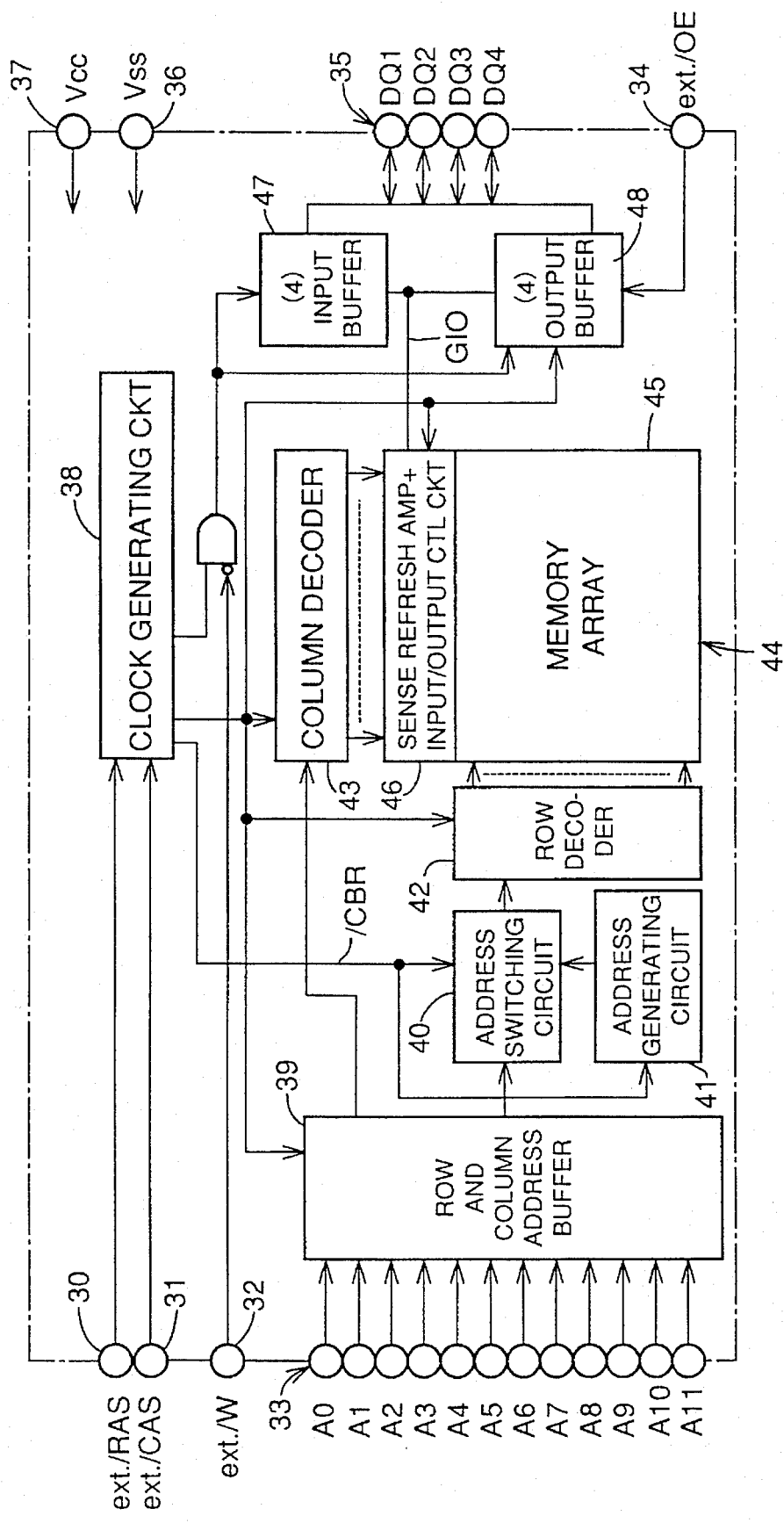
FIG. 5 is a circuit block diagram showing a configuration of a conventional DRAM.
Figure 6:
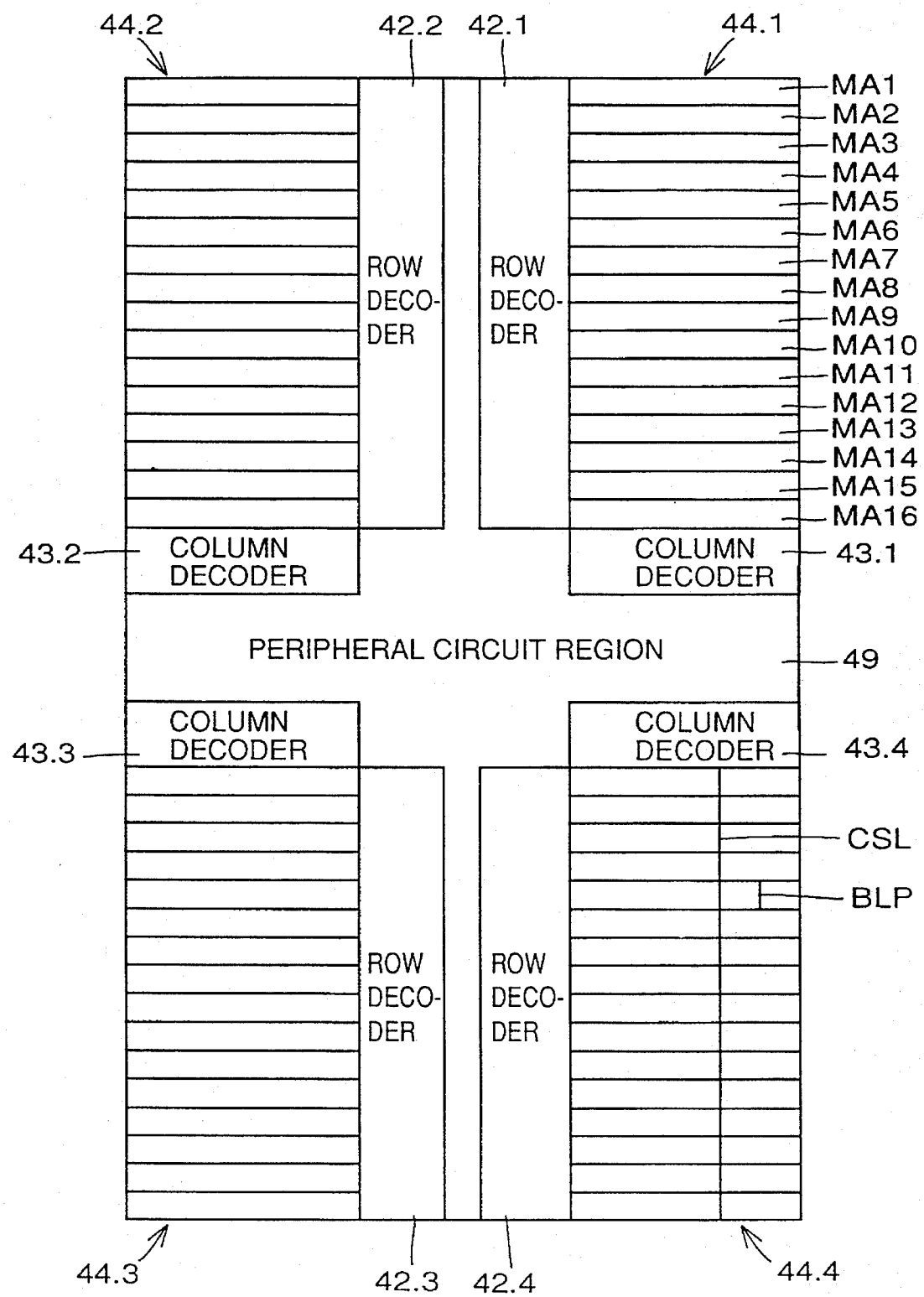
FIG. 6 is a diagram showing a chip layout of the DRAM shown in FIG. 5.
Figure 7:
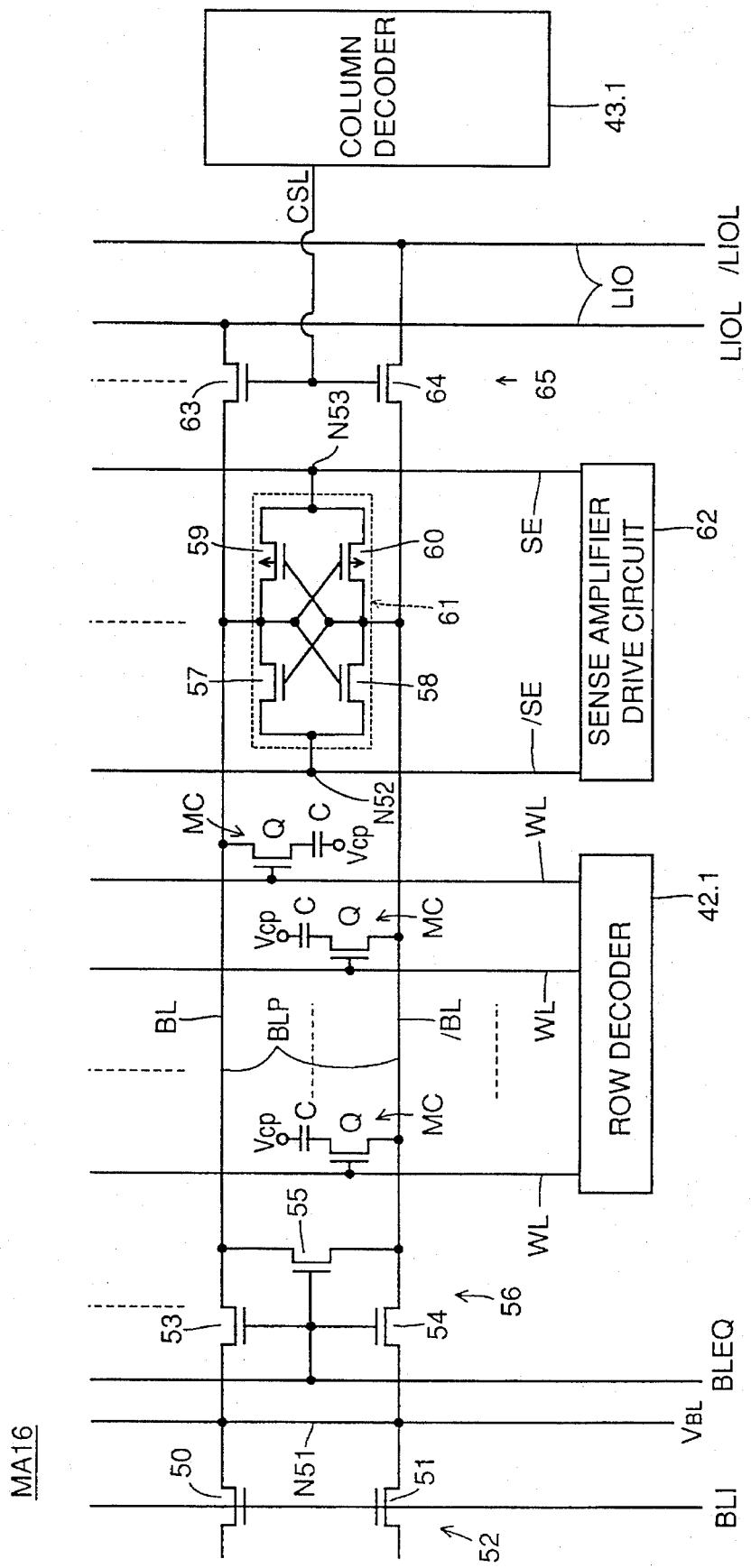
FIG. 7 is a circuit block diagram showing a configuration of a memory array of the DRAM shown in FIG. 5 with one part omitted.
Figure 8:
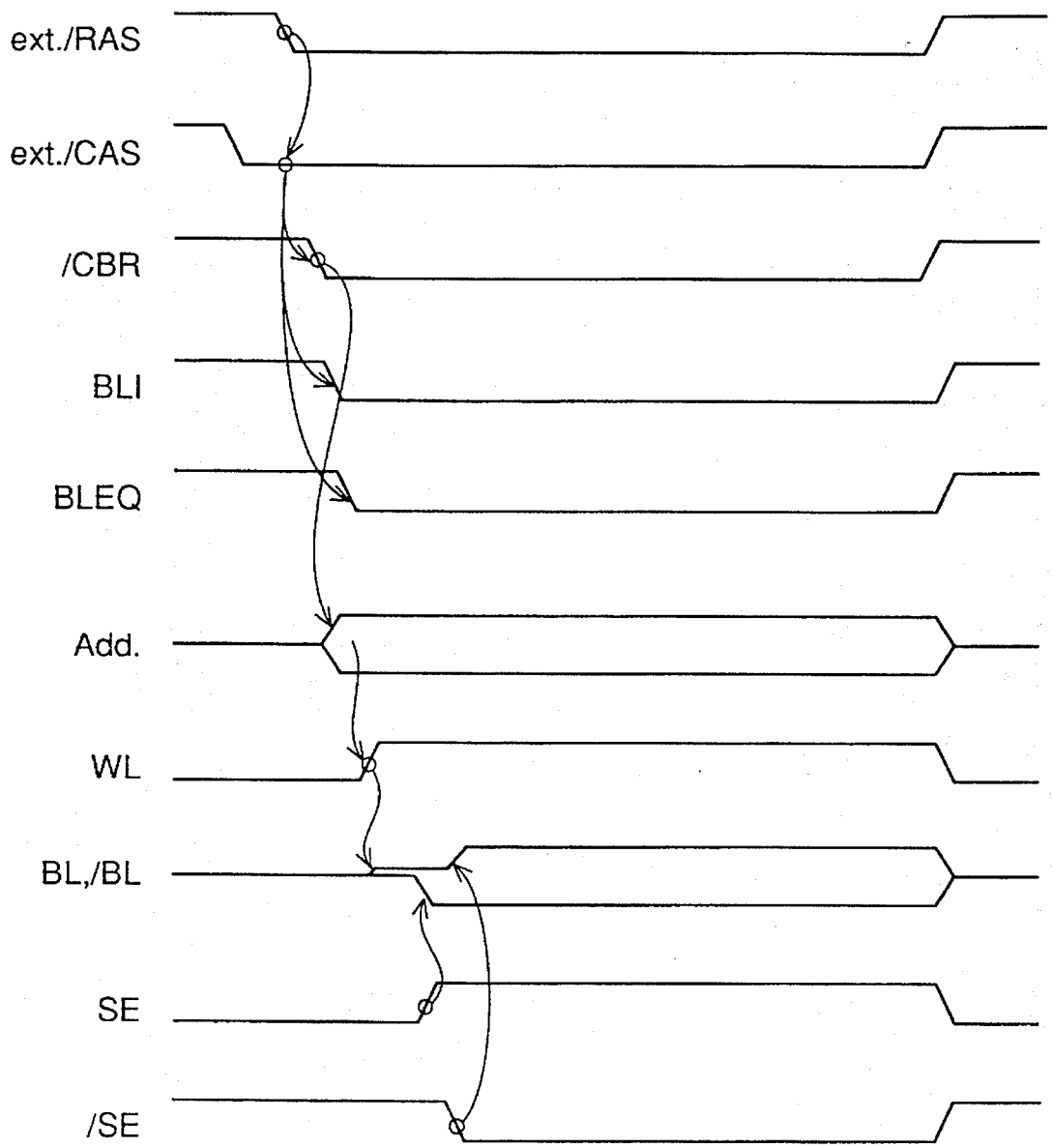
FIG. 8 is a timing chart showing a refresh operation of the DRAM shown in FIG. 5.

FIG. 4 is a timing chart showing the operation of address generating circuit 1 when the refresh cycle time Tref is shorter than the sum Ts+Td of the set time Ts and the delay time Td.

In response to the first input of the signals ext./RAS and ext./CAS, the refresh instruct signal/CBR falls to the L level. In response to the falling, the output S1 of latch circuit 6 attains the L level, and the output Tout of timer 3 attains the H level after the delay time Td, similar to the case of the operation shown in FIG. 3.

In response to the second input of the signals ext./RAS and ext./CAS, the refresh instruct signal/CBR falls to the level. In response to the falling, latch circuit 6 latches the output Tout of timer 3. Since the output Tout of timer 3 is not yet at the L level at this time, the output S1 of latch circuit 6 attains the H level, and the 4K mode is selected. The similar operation continues.

A specific description will be given of the case where the DRAM is a 4K mode 64 ms product. In the 4K mode 64 ms product, the delay time Td of delay circuit 7 is set to 1 µs, for example, and the set time Ts of binary counter 5 is set to 16 µs, which is a standard value of the refresh cycle time Tref of the 4K mode 64 ms product. Note that a memory cell row is sufficiently refreshed even in the 4K mode if the refresh cycle time Tref set by the user is less than 17 µs.

In this case, if the refresh cycle time Tref set by the user is less than 17 µs, the 4K mode is selected, and the refresh operation according to the standard is carried out. If the refresh cycle time Tref set by the user is equal to or greater than 17 µs, the 2K mode is selected, and the refresh ability is improved.

Therefore, in this DRAM, even when the user sets the refresh cycle time Tref to a value longer than the standard value (=16 µs) in order to gain the write and read times, a memory cell row can be sufficiently refreshed if the refresh cycle time Tref is less than 34 µs. Data of memory cell MC does not disappear.

A specific description will now be given of the case where the DRAM is a 2K mode 32 ms product. In the 2K mode 32 ms product, the delay time Td of delay circuit 7 is set to 1 µs, for example, and the set time Ts of binary counter 5 is set to 8 µs, which is ½ the standard value (=16 µs) of the refresh cycle time Tref of the 2K mode 32 ms product. Note that a memory cell row is sufficiently refreshed even in the 4K mode if the refresh cycle time Tref set by the user is less than 9 µs.

In this case, if the refresh cycle time Tref set by the user is equal to or longer than 9 µs, the 2K mode is selected, and the refresh operation according to the standard is carried out. If the refresh cycle time Tref set by the user is less than 9 µs, the 4K mode is selected, and power consumption is decreased.

Therefore, in the DRAM, even when the user sets the refresh cycle time Tref to a value smaller than necessary for fear of disappearance of data, increase of power consumption can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device which y requires refresh of data, comprising:
   a memory array including a plurality of memory cells arranged in rows and columns;
   detecting means receiving a refresh instruct signal instructing refresh of said data for detecting a refresh cycle time using a previous input of the refresh instruct signal;
   selecting means for selecting either a first number of memory cell rows or a second number of memory cell rows, greater than the first number, for refresh of data based on said refresh cycle time detected by said detecting means; and
   refresh means for carrying out refresh of data of the memory cell row selected by said selecting means.

2. A semiconductor memory device which requires refresh of data, comprising;
   a memory array including a plurality of memory cells arranged in rows and columns;
   determining means receiving a refresh instruct signal instructing refresh of said data for determining a number of word lines to be selected in a refreshing operation from a refresh cycle time of the refresh instruct signal and a predetermined time interval;

selecting means for selecting a first number of memory cell rows for refresh of data when said refresh cycle time is shorter than said predetermined time, and for selecting a second number of memory cell rows, greater than the first number, for refresh of data when said refresh cycle time is longer than said predetermined time; and refresh means for carrying out refresh of data of the memory cell row selected by said selecting means.

3. The semiconductor memory device as recited in claim 2, wherein said determining means includes
   delay means for delaying said refresh instruct signal by a predetermined time,
   timer means reset by the refresh instruct signal delayed by said delay means for outputting a signal at a first level until a predetermined time passes from reset, and outputting a signal at a second level thereafter, and
   latch means responsive to said refresh instruct signal for latching an output level of said timer means, and
said selecting means selects said first number of memory cell rows according to a latch level of said latch means being said first level, and selects said second number of memory cell rows according to the latch level of said latch means being said second level.

4. The semiconductor memory device as recited in claim 3, wherein said selecting means includes
   signal generating means responsive to said refresh instruct signal for outputting a first address signal indicating said first number of memory cell rows which are different from previously refreshed cell rows,
   signal converting means for receiving said first address signal output from said signal generating means and converting, according to the latch level of said latch means being said second level, said first address signal into a second address signal indicating said second number of memory cell rows which are different from the first number of previously refreshed memory cell rows, and
   decode means receiving the first or second address signal output from said signal converting means for selecting memory cell rows according to the address signal.

* * * * *